(12) United States Patent
Wickramasinghe et al.

(10) Patent No.: US 7,692,244 B2
(45) Date of Patent: Apr. 6, 2010

(54) ELECTRONICALLY SCANNABLE MULTIPLEXING DEVICE

(75) Inventors: Hemantha Kumar Wickramasinghe, San Jose, CA (US); Kailash Gopalakrishnan, Mountain View, CA (US)

(73) Assignee: International Business Machines Corporation, Armonk, NY (US)

( * ) Notice: Subject to any disclaimer, the term of this patent is extended or adjusted under 35 U.S.C. 154(b) by 331 days.

(21) Appl. No.: 11/926,025

(22) Filed: Oct. 28, 2007

(65) Prior Publication Data

US 2008/0251840 A1    Oct. 16, 2008

Related U.S. Application Data

(62) Division of application No. 11/117,276, filed on Apr. 27, 2005, now Pat. No. 7,352,029.

(51) Int. Cl.
 *H01L 27/01* (2006.01)
 *H01L 27/12* (2006.01)
 *H01L 31/0392* (2006.01)

(52) U.S. Cl. ............... 257/348; 257/392; 257/E29.167

(58) Field of Classification Search ................ 257/348, 257/392, E29.167, E29.325, E21.703
See application file for complete search history.

(56) References Cited

U.S. PATENT DOCUMENTS

| 7,352,029 B2 * | 4/2008 | Wickramasinghe et al. . 257/331 |
| 7,385,234 B2 * | 6/2008 | Gopalakrishnan et al. ... 257/213 |
| 7,514,327 B2 * | 4/2009 | Wickramasinghe et al. . 438/284 |

* cited by examiner

*Primary Examiner*—Thien F Tran
(74) *Attorney, Agent, or Firm*—Samuel A. Kassatly; Jon A. Gibbons; Fleit, Gibbons, Gutman, Bongini & Bianco P.L.

(57) ABSTRACT

An electronically scannable multiplexing device is capable of addressing multiple bits within a volatile or non-volatile memory cell. The multiplexing device generates an electronically scannable conducting channel with two oppositely formed depletion regions. The depletion width of each depletion region is controlled by a voltage applied to a respective control gate at each end of the multiplexing device. The present multi-bit addressing technique allows, for example, 10 to 100 bits of data to be accessed or addressed at a single node. The present invention can also be used to build a programmable nanoscale logic array or for randomly accessing a nanoscale sensor array.

1 Claim, 18 Drawing Sheets

ELECTRONICALLY SCANNABLE MULTIPLEXING DEVICE

CROSS REFERENCE TO RELATED APPLICATIONS

This is a divisional application which is based upon and claims priority from prior U.S. patent application Ser. No. 11/117,276, filed on Apr. 27, 2005, now U.S. Pat. No. 7,352,029, the entire disclosure of which is herein incorporated by reference in its entirety.

FIELD OF THE INVENTION

The present invention generally relates to the field of semiconductor devices. More specifically, the present invention relates to a semiconductor multiplexing device that generates an electronically scannable conducting channel with two oppositely formed depletion regions. The multiplexing device has numerous applications. For example, the multiplexing device could be used to address multiple bits within a memory cell, or to connect nano lines to micro lines within a minimal space or could be used to build a nanoscale programmable logic array or to perform chemical and/or biological sensing at the nanoscale (molecular) level.

BACKGROUND OF THE INVENTION

Conventional memory devices are limited to mostly 1 bit at the intersection of a wordline (WL) and a bitline (BL) in a memory array. For example, DRAM devices are limited to 1 bit per intersection, which corresponds to the presence of only one capacitor at each node. Similarly, FLASH devices have at most 2 bits per cell, in a multibit or multilevel configuration. These 2 bits can be detected based on the magnitude and direction of the current flow across the cell.

However, conventional memory devices are not capable of easily accommodating more than two memory bits at every crosspoint intersection. It would therefore be desirable to expand the access capability in memory devices to select or read multiple bits at every memory area or crosspoint that is normally desired by one memory wordline and bitline.

One problem facing conventional semiconductor lithographic techniques is the ability to electrically interconnect nano-scaled lines or patterns (on the order of 1 nm to 100 nm) and micro-scaled lines or patterns (on the order of 90 nm or a feature that could be typically defined by semiconductor processes such as lithography). Such connection is not currently practical, as it requires a significant interconnect semiconductor area, which increases the cost and complexity of the manufacturing process or the final product.

It would therefore be desirable to have a multiplexing device or an addressing device that establishes selective contact to memory cells, logic devices, sensors, or between nano-scaled lines and micro-scaled lines within a minimal space, thus limiting the overall cost and complexity of the final product.

The need for such a multiplexing device has heretofore remained unsatisfied.

SUMMARY OF THE INVENTION

The present invention satisfies this need, and presents a multiplexing device capable of selectively addressing multiple nodes or cross-points, such as multiple bits within a volatile or non-volatile memory cell. This multi-node addressing aspect of the present invention uses the fact that wordline and bitline voltages can be varied in a continuous fashion, to enable the selection or reading of multiple states at every crosspoint.

The present multi-node addressing technique allows, for example, 10 to 100 bits of data to be recorded at a single node, or in general to access bits of data that are of the order of 100 times more densely packed than conventional lithographically defined lines. As used herein, a node includes for example the intersection of a wordline and a bitline, such as a memory wordline and bitline.

The multiplexing devices selectively generates a thin, elongated, semiconducting (or conducting) channel (or window) at a desired location within a substrate, to enable control of the width of the channel, from a first conducting sea of electrons on one side of the substrate to a second conducting sea of electrons on the other side of the substrate.

In one embodiment, the multiplexing device generates an electronically scannable conducting channel with two oppositely formed depletion regions. The depletion width of each depletion region is controlled by a voltage (or potential) applied to a respective control gate at each end of the multiplexing device.

In another embodiment, the depletion width is controlled from one control gate only, allowing the access to the memory bits for both the reading and writing operations to be sequential. Other embodiments are also contemplated by the present invention.

If the depletion width is controlled at both ends of the multiplexing device, along the same axis, the conducting channel can be small (e.g., sub 10 nm) to enable random access to the memory bits. This embodiment is applicable to random access memories, such as SRAM, DRAM, and FLASH, for embedded and standalone applications and to programmable logic arrays.

BRIEF DESCRIPTION OF THE DRAWINGS

The various features of the present invention and the manner of attaining them will be described in greater detail with reference to the following description, claims, and drawings, wherein reference numerals are reused, where appropriate, to indicate a correspondence between the referenced items, and wherein:

DETAILED DESCRIPTION OF PREFERRED EMBODIMENTS

Figure 1:
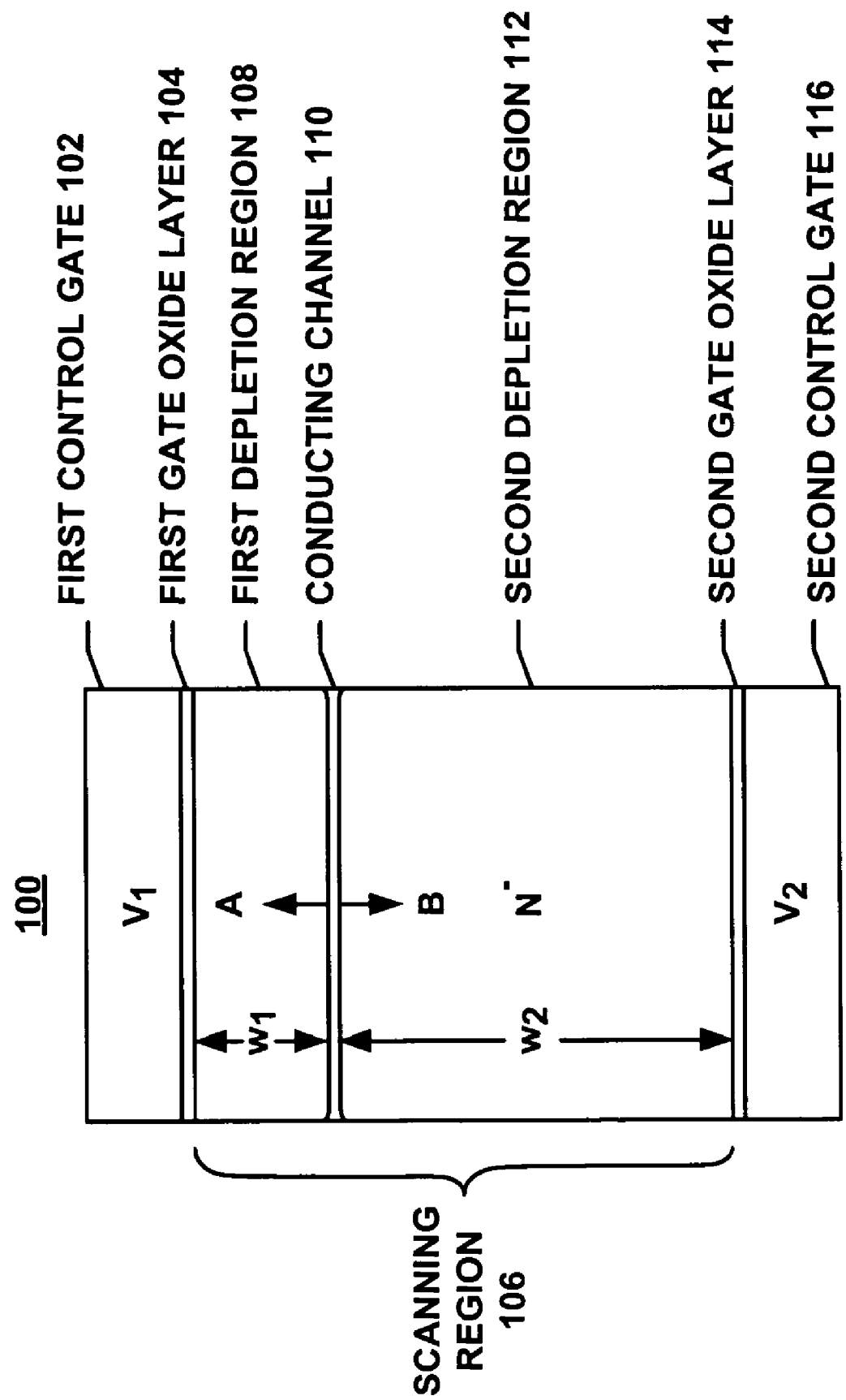
FIG. 1 is a schematic illustration of an exemplary multiplexing device of the present invention, comprising a scannable conducting channel having a relatively narrow width, shown in a first position within a scanning region.
Figure 2:
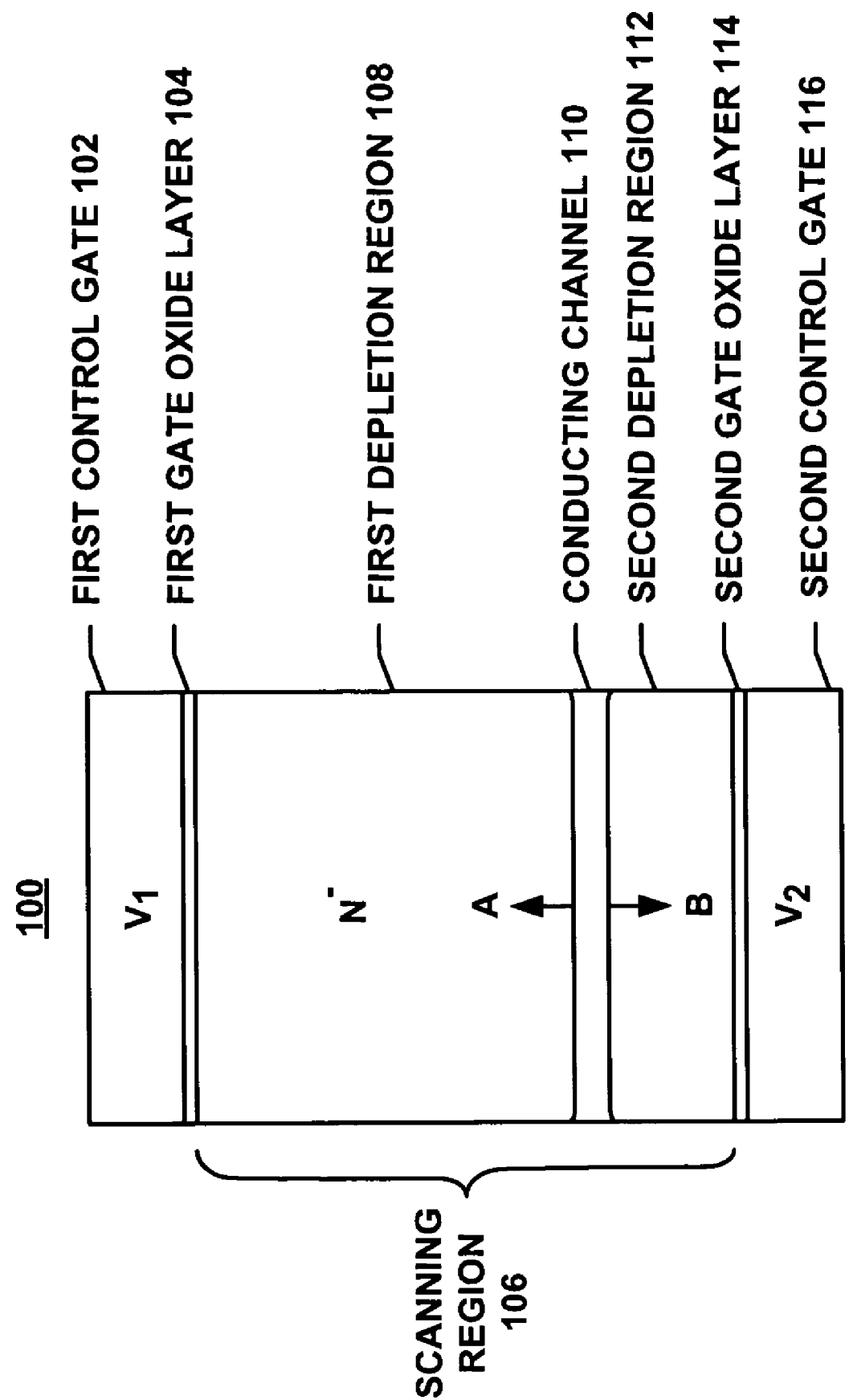
FIG. 2 is a schematic illustration of the multiplexing device of FIG. 1, showing the scannable conducting channel with a relatively wider width, in a second position within the scanning region.

FIGS. 1 and 2 illustrate an exemplary multiplexing device 100 of the present invention. The multiplexing device 100 comprises a conducting channel 110 that is controllably scannable within a scanning region 106. A first gate oxide layer 104 is disposed intermediate the scanning region 106 and a first control gate 102, at one end of the multiplexing device 100. At the opposite end of the multiplexing device 100, a second gate oxide layer 114 is disposed intermediate the scanning region 106 and a second control gate 116.

When suitably biased by a potential $V_1$, the first control gate 102 generates a first depletion region 108 in the scanning region 106. Similarly, when the second control gate 116 is suitably biased by a potential $V_2$, it generates a second depletion region 112 in the scanning region 106. The first and second depletion regions 108, 112 interact to generate the conducting channel 110.

The width $w_1$ of the first depletion region 108 is regulated by the potential $V_1$ and the doping concentration in the scanning region 106. Similarly, the width $W_2$ of the second depletion region 112 is regulated by the potential $V_2$ and the doping concentration in the scanning region 106. As a result, the width and the position of the conducting channel 110 can be very precisely controlled. FIGS. 1 and 2 illustrate the conducting channel 110 at two different positions along the scanning region 106, and having different widths.

In a structure that is suitable for the formation of multiplexing device 100, the first and second control gates 102 and 116, respectively, are formed of conductive layers. As used herein a conductive layer can be formed of any suitable conductive or semiconductive material. For example the conductive layer can be formed of copper, tungsten, aluminum, a silicided layer, a salicided layer, a semiconductive layer, or a conductive layer, such as metallic materials, polysilicon, silicon germanium, metallic composites, refractory metals, conductive composite materials, epitaxial regions, amorphous silicon, titanium nitride, or like conductive materials. Preferably, the conductive layers are formed of polysilicon layers that are doped with dopant atoms. Dopant atoms can be, for example, arsenic and/or phosphorus atoms for n-type material, or boron atoms for p-type material.

Although the first and second control gates 102 and 116 can be lithographically defined into two distinct sections that are oppositely disposed relative to the scanning region 106, as illustrated in FIG. 1, it should be clear that the first and second control gates 102 and 116 could be disposed at different positions relative to the scanning region 106. In particular, while the multiplexing device 100 is illustrated as having a generally rectangular shape, it should be clear that multiplexing device 100 could assume various other shapes, such as circular, oval, square, and various other shapes. Some of these alternative designs for the multiplexing device 100 could require the allocation of the first and second control gates 102 and 116 at various positions that are not necessarily opposite.

The two distinct sections of the first and second control gates 102 and 116 can be of a different conductivity type, for example: one section can be n-type while the other section can be p-type dopants or the two regions could have different metals. Known or available masking and ion implanting techniques can be used to alter the doping of portions of conductive layers.

The first and second control gates 102 and 116 can have the same or different widths. The width of each control gate can, for example, exceed 1000 angstroms. The voltages $V_1$ and $V_2$ applied to the first and second control gates 102 and 116, respectively, can vary between approximately 0 and +/−100 volts.

A dielectric first gate oxide layer 104 is formed intermediate the first control gate 102 and the scanning region 106. Similarly, a dielectric second gate oxide layer 114 is formed intermediate the second control gate 116 and the scanning region 106. As used herein a dielectric layer can be any insulator such as wet or dry silicon dioxide ($SiO_2$), hafnium oxide, silicon nitride, tetraethylorthosilicate (TEOS) based oxides, borophospho-silicate-glass (BPSG), phospho-silicate-glass (PSG), boro-silicate-glass (BSG), oxide-nitride-oxide (ONO), oxynitride materials, plasma enhanced silicon nitride (p-$SiN_x$), a spin on glass (SOG), titanium oxide, or like dielectric materials or composite dielectric films with a high k gate dielectric. A preferred dielectric material is silicon dioxide.

The scanning region 106 can be formed of any suitable, depletable material. In this exemplary illustration, the scanning region 106 is formed of a depletion region, such as silicon or polysilicon layer that is lightly doped with either an n-type dopant, or a p-type dopant. In this exemplary embodiment, the scanning region 106 is doped with an n-type dopant. The width of the scanning region 106 could exceed 5 nm. The various components of regions and layers of the multiplexing devices described herein, could be made using, for example, known or available methods, such as, for example, lithographic processes.

In operation, by varying the voltages $V_1$ and $V_2$ on the first and second control gates 102, 116, respectively, the conducting channel 110 is controllably scanned along the directions of the scanning arrows A and B, up and down the central column of the multiplexing device 100. In the present exemplary embodiment, the width, w (e.g., w1, w2) of the depletion regions 108, 112 is determined by the following equation:

$$w = (2)^{1/2} \lambda_n (v_l)^{1/2}$$

where $\lambda_n$ is the extrinsic Debye length of the conducting channel 110; $v_l$ is defined by $(q^*(V_{bi}+V)/kT)-2$ where $V_{bi}$ is the built-in potential and V is the applied voltage. For an n-concentration of 10**16/cc the maximum depletion width is on the order of 1 micron.

FIG. 2 is a schematic illustration of the multiplexing device of FIG. 1, showing the scannable conducting channel 110 with a relatively wider width, in a second position within the scanning region 106.

Figure 3:
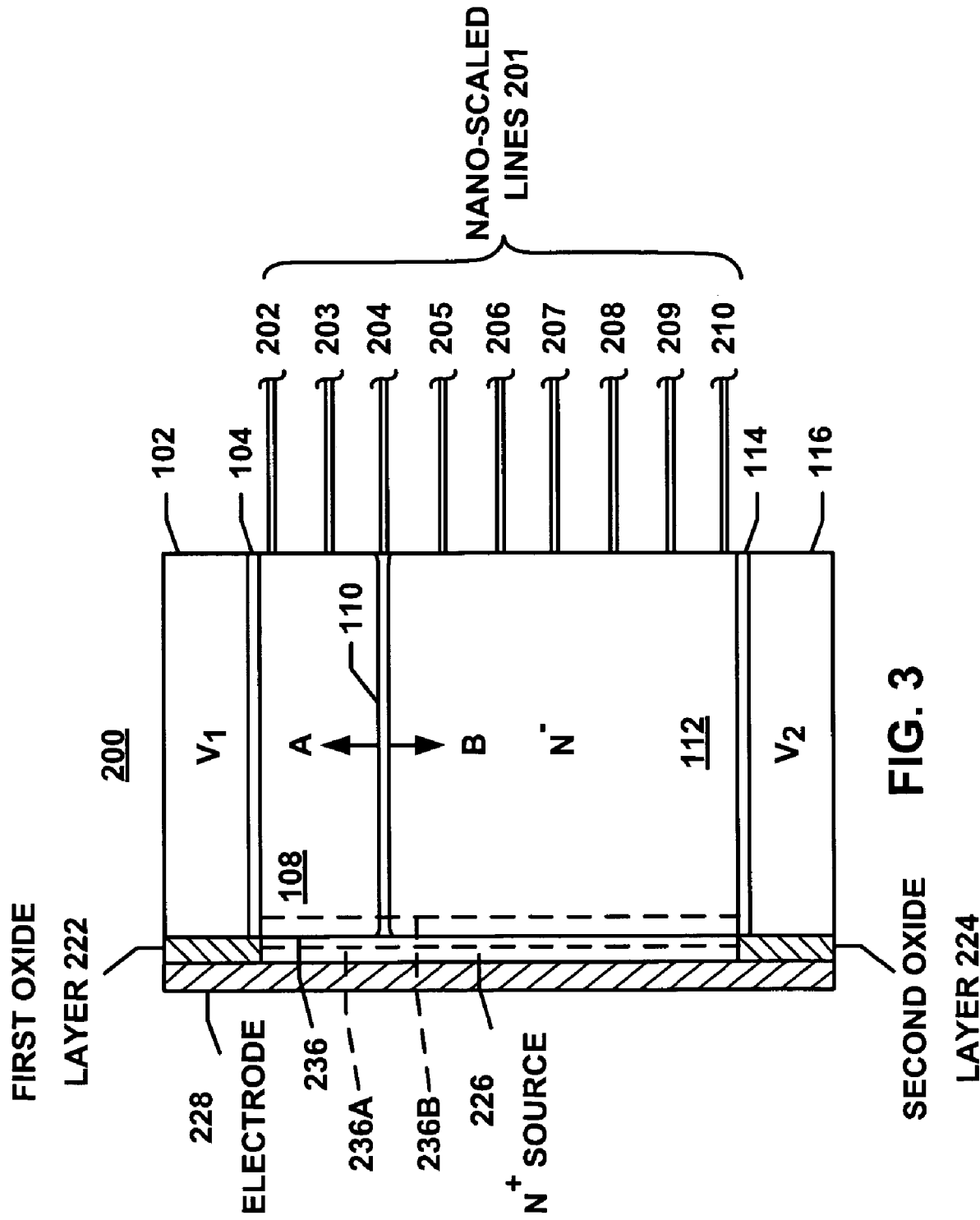
FIG. 3 is a schematic illustration of another embodiment of the multiplexing device of FIGS. 1 and 2, wherein the scannable conducting channel connects conducting lines, such as nano-scaled lines, on one side of the multiplexing device to electrodes on the opposite side of the multiplexing device.

FIG. 3 illustrates another multiplexing device 200 according to an alternative embodiment of the present invention, wherein the scannable conducting channel 110 connects conducting lines 201, such as nano-scaled lines 202 through 210 (e.g., having a width between approximately 5 angstroms and 1,000 angstroms), on one side of the multiplexing device 200, to one or more electrodes 228 on the opposite side of the multiplexing device 200. To this end, the multiplexing device 200 further includes a source 226, a first oxide layer 222, and a second oxide layer 224.

In this exemplary embodiment, the first oxide layer 222 is in contact with the first control gate 102 and the first gate oxide layer 104. Similarly, the second oxide layer 224 is in contact with the second control gate 116 and the second gate oxide layer 114. The source 226 is formed intermediate the first oxide layer 222 and the second oxide layer 224, in contact with the scanning region 106, and the electrode 228. Layers 222 and 224 serve to isolate the gate regions 102 and 116 from the electrode (228) and source (226).

The source 226 can be formed of a silicon or polysilicon layer that is doped with either an n-type dopant, or a p-type dopant. The source 226 could be formed of any conductive or semiconductive material that forms an electrical contact to the scanning region 106 and electrode 228. In this exemplary embodiment, the source 226 is doped with an n+-type dopant. In operation, the conducting channel 110 is generated as explained earlier in connection with FIGS. 1 and 2, and is scanned across the scanning region 106 to establish contact with the desired line, for example line 204, allowing the source 226 to inject electrons through the conducting channel 110, into the selected line 204.

In FIG. 3, the source 226 has an inner surface 236 that is illustrated as being generally flush with the oxide layers 222, 224. It should however be understood that the inner surface 236A of the source 226 could alternatively be recessed relative to the oxide layers 222, 224, as shown in a dashed line.

Alternatively, the inner surface 236B of the source 226 could extend beyond the oxide layers 222, 224, as shown in a dashed line.

Figure 4:
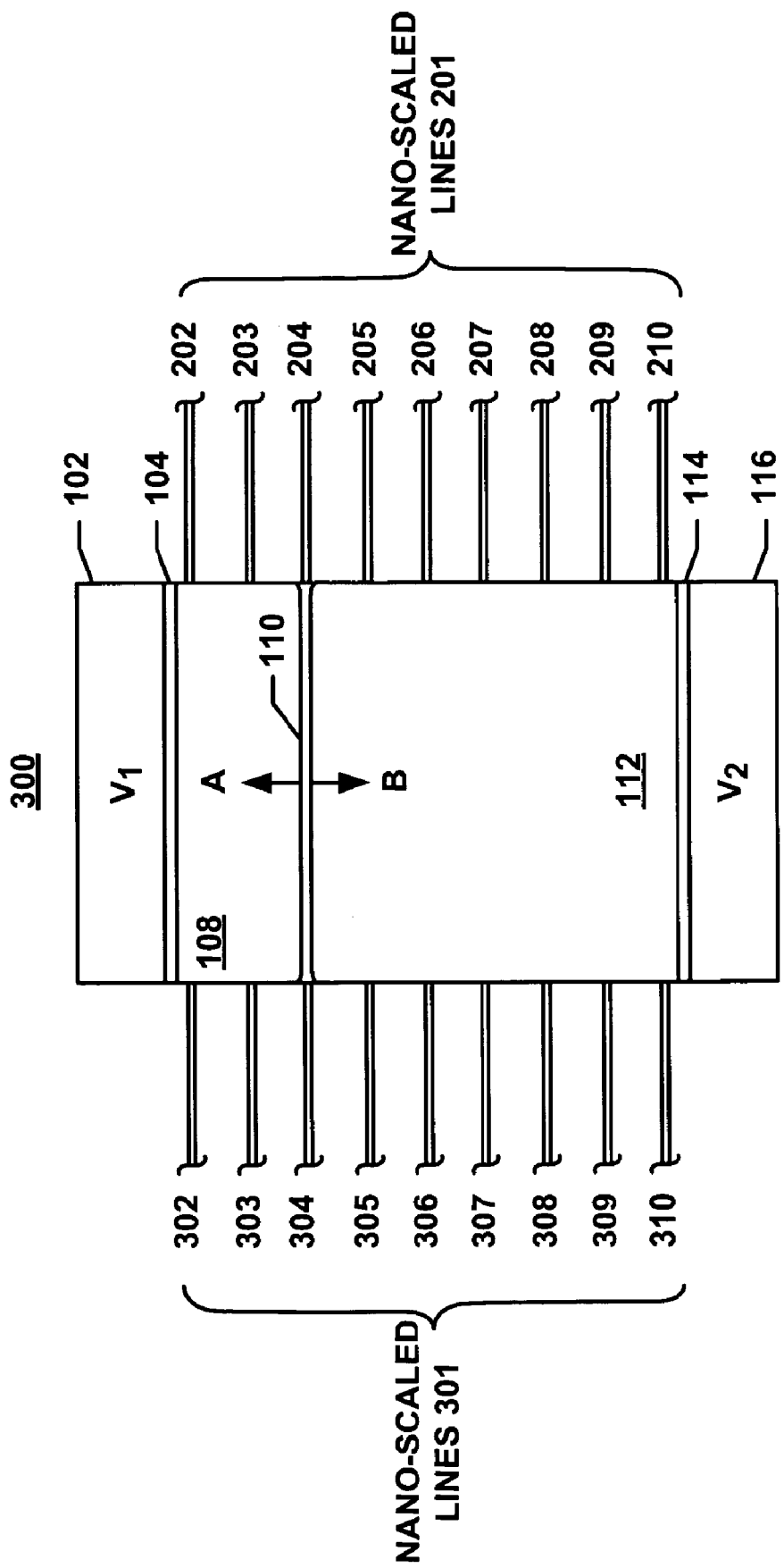
FIG. 4 is a schematic illustration of yet another embodiment of the multiplexing device of FIG. 3, wherein the scannable conducting channel connects conducting lines, such as nano-scaled lines, on one side of the multiplexing device to other conducting lines, such as nano-scaled lines, on the opposite side of the multiplexing device.

FIG. 4 illustrates another multiplexing device 300 according to the present invention. Multiplexing device 300 is generally similar in construction to the multiplexing device 200 of FIG. 3, but is designed for a different application. The scannable conducting channel 110 of the multiplexing device 300 connects conducting lines 201, such as nano-scaled lines 202-210, on one side of the multiplexing device 300, to other conducting lines 301, such as nano-scaled lines 302-310, on the opposite side of the multiplexing device 300.

In this exemplary embodiment, the lines 301 are coaxially aligned with the lines 201, so that the conducting channel 110 interconnects two aligned lines, such as lines 204 and 304.

Figure 5:
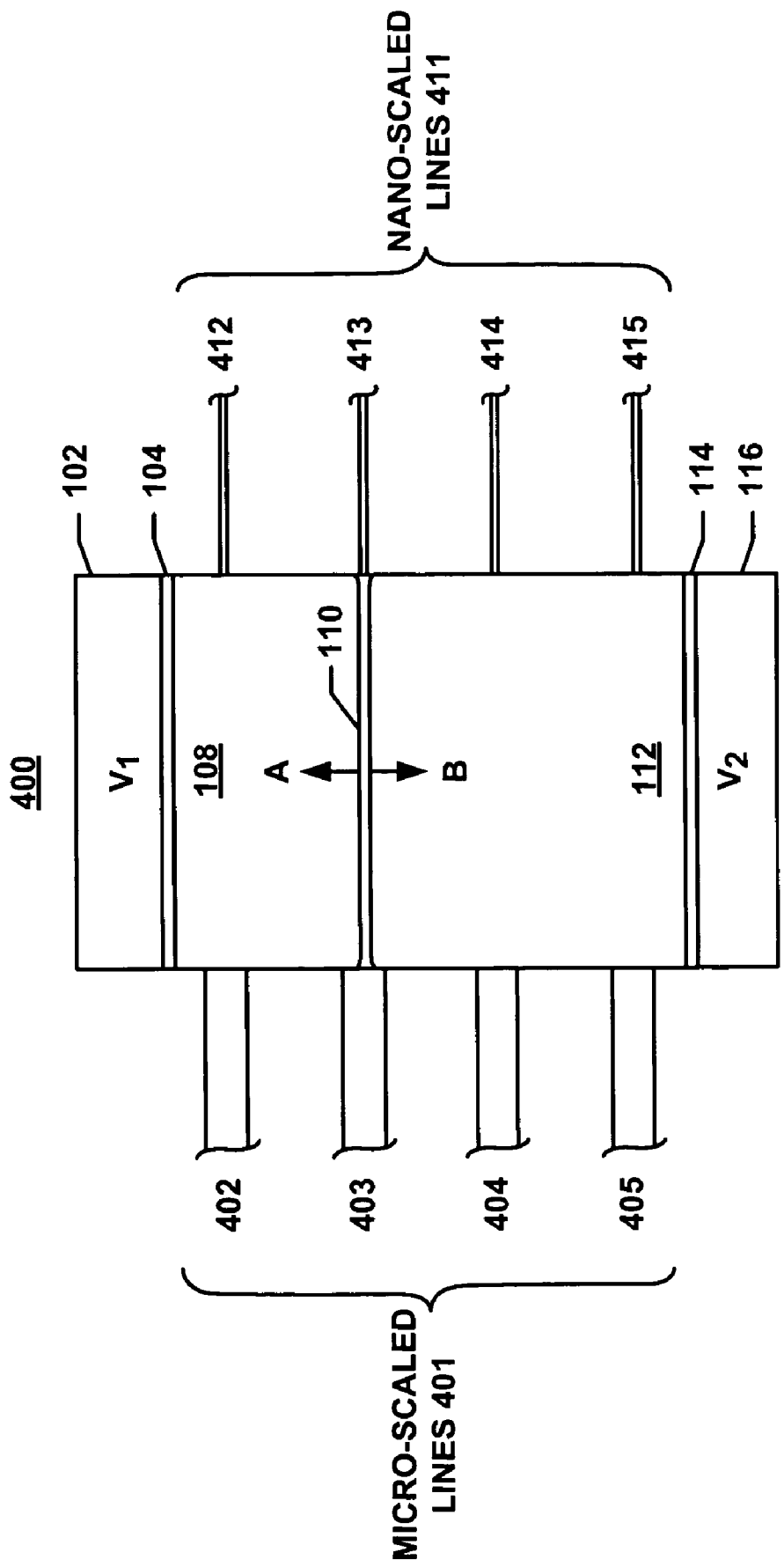
FIG. 5 is a schematic illustration of still another embodiment of the multiplexing device of FIG. 4, wherein the scannable conducting channel connects conducting lines, such as nano-scaled lines, on one side of the multiplexing device to other conducting lines, such as micro-scaled lines, on the opposite side of the multiplexing device.

FIG. 5 illustrates another multiplexing device 400 according to the present invention. Multiplexing device 400 is generally similar in construction to the multiplexing device 300 of FIG. 4, but is designed for a different application. The scannable conducting channel 110 connects conducting lines 401, such as nano-scaled lines 402-405, on one side of the multiplexing device 400 to other conducting lines 411, such as micro-scaled lines 412-415, on the opposite side of the device 400 (e.g., having a width that exceeds approximately 100 angstroms).

Figure 6:
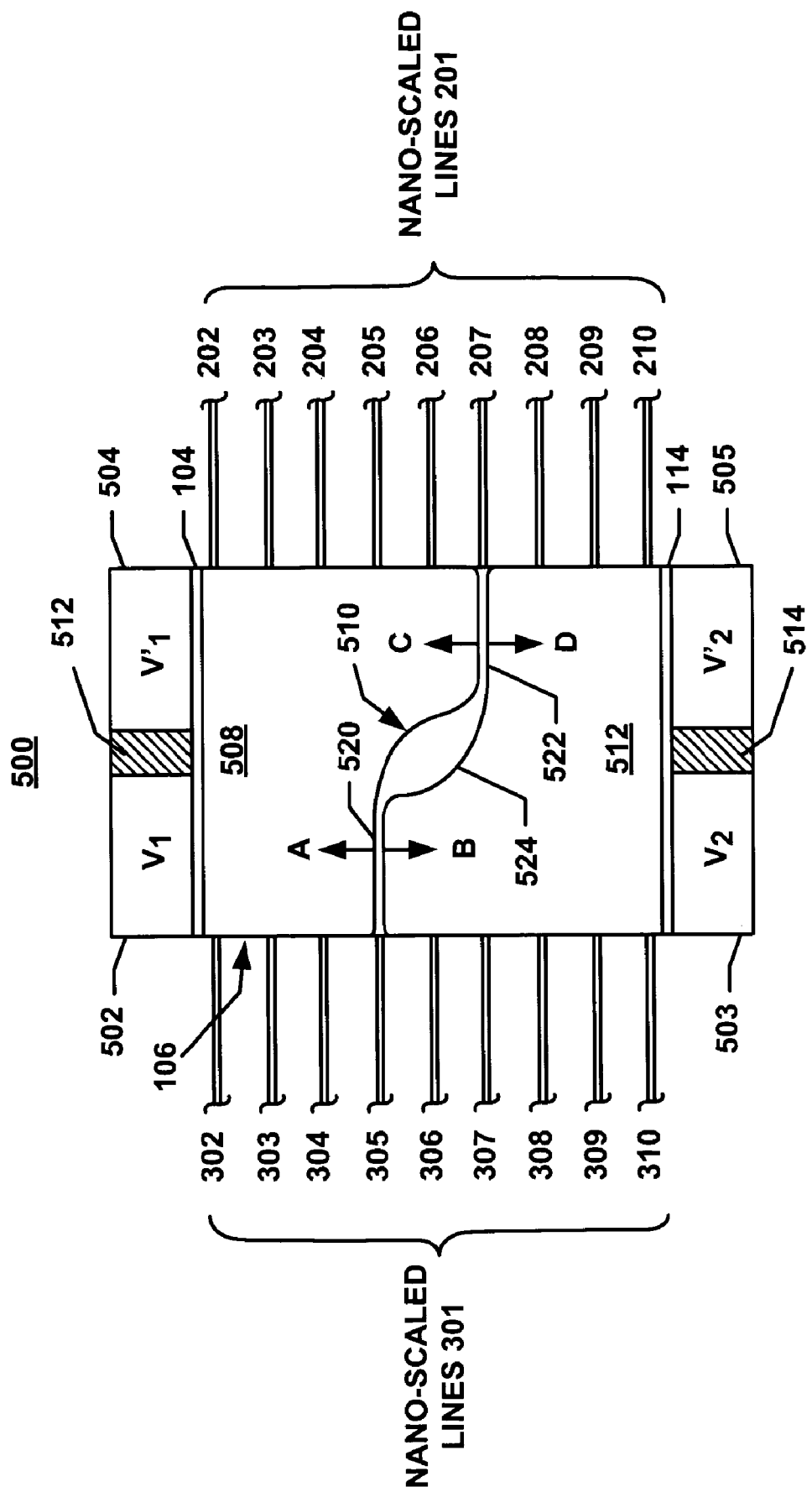
FIG. 6 is a schematic illustration of another embodiment of the multiplexing device of the previous figures, wherein the scannable conducting channel is curvilinearly (non-linearly) controlled, to connect non-coaxially (or coplanarly) disposed lines on both sides of the multiplexing device.

FIG. 6 illustrates another multiplexing device 500 according to the present invention. Multiplexing device 500 is generally similar in construction to the multiplexing devices 100, 200, and 300 of FIGS. 1-3, but will be described, for simplicity of illustration, in connection with the design of multiplexing device 300 of FIG. 4. The scannable conducting channel 510 is curvilinearly (non-linearly) controlled, to connect non-coaxially (or coplanarly) disposed lines 201, 301 on both sides of the multiplexing device 500.

In order to effect this curvilinear conducting channel 510, the multiplexing device 500 is provided with four control gates 502, 503, 504, 505 that are arranged in pairs, on opposite sides of the scanning region 106. In this specific example, the control gates 502, 504 are disposed, adjacent to each other, on one side of the scanning region 106, and are separated by an insulation layer 512. Similarly, the control gates 503, 505 are disposed, adjacent to each other, on the opposite side of the scanning region 106, and are separated by an insulation layer 514.

Potentials can be applied independently to the control gates 502-505, to generate a first depletion region 508 and a second depletion region 512, so that the conducting channel 510 is curvilinear. To this end, control gates 502 and 503 are paired, so that when a potential $V_1$ is applied to the control gate 502 and a potential $V_2$ is applied to the control gate 503, a first portion 520 of the conducting channel 510 is formed. Similarly, when a potential $V'_1$ is applied to the control gate 504 and a potential $V'_2$ is applied to the control gate 505, a second portion 522 of the conducting channel 510 is formed.

Portions 520 and 522 of the conducting channel 510 are not necessarily co-linear, and are interconnected by an intermediate curvilinear section 524. As a result, it is now possible to connect line 207 to line 305 even though these two lines are not co-linearly disposed. Other lines on opposite (or different) sides of the multiplexing device 500 could be interconnected by the conducting channel 510, by independently scanning the first and second portions 520, 522 of the conducting channel 510, along the arrows (A, B) and (C, D), respectively.

While FIG. 6 illustrates only four control gates 502-505, it should be clear that more than four gates can alternatively be used.

Figure 6A:
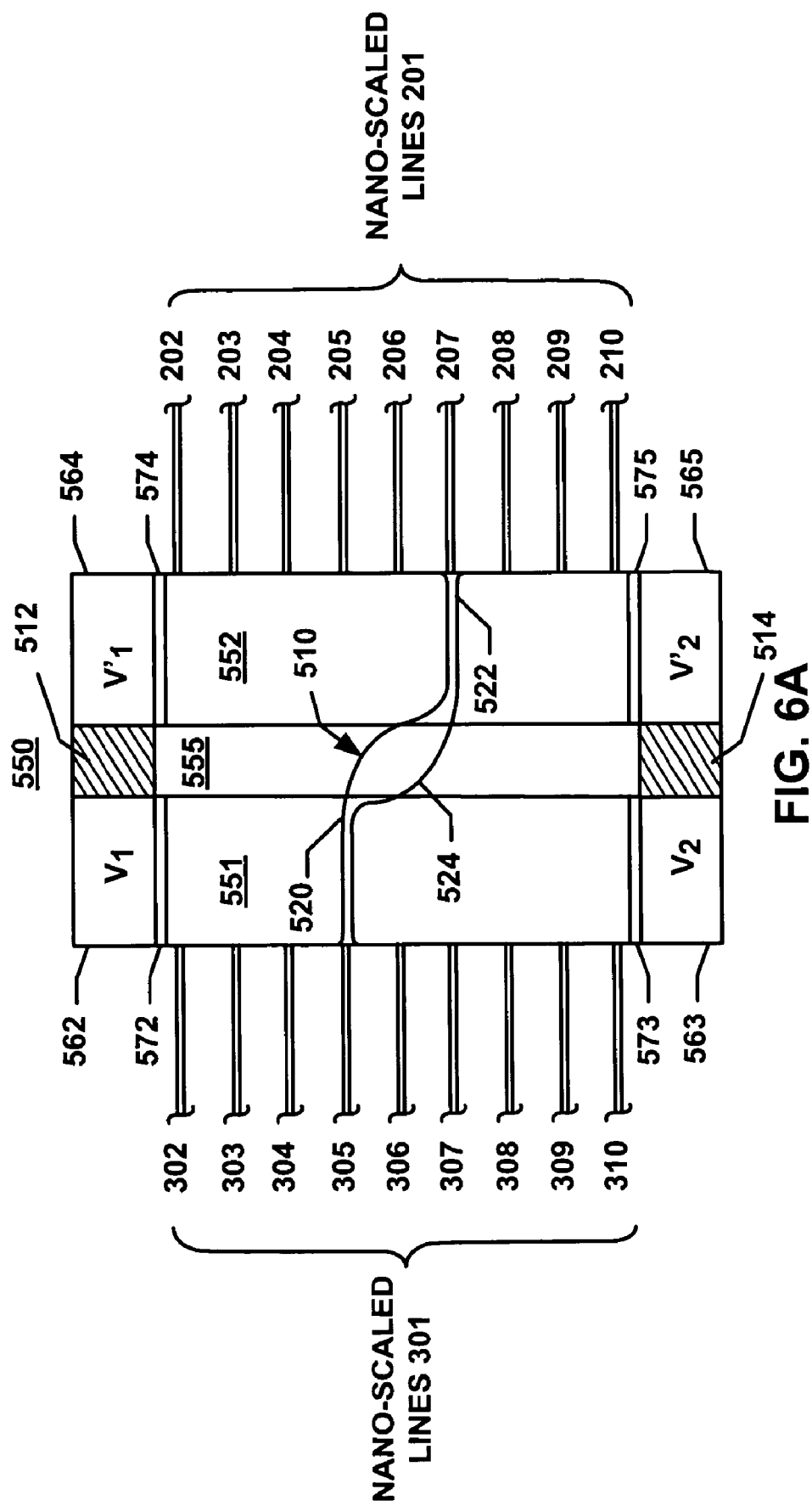
FIG. 6A is a schematic illustration of another embodiment of the multiplexing device of FIG. 6, illustrating two discrete depletable regions separated by a transition region therebetween.

FIG. 6A illustrates another multiplexing device 550 according to the present invention. Multiplexing device 550 is generally similar in construction to the multiplexing device 500 of FIG. 6. Similarly to FIG. 6, the scannable conducting channel 510 is curvilinearly (non-linearly) controlled, to connect non-coaxially (or coplanarly) disposed lines 201, 301 on both sides of the multiplexing device 550. However, the switching device 550 comprises two discrete depletion regions 551, 552 that are separated by an intermediate, electrically conducting transition region 555.

In order to effect the curvilinear conducting channel 510, the multiplexing device 500 is provided with four control gates 562, 563, 564, 565 that are arranged in pairs, on opposite sides of the scanning regions 551, 552, wherein each pair of control gates is separated from the other pair by the intermediate transition region 555. In this specific example, the control gates 562, 564 are disposed, adjacent to each other, and are separated by the intermediate transition region 555, while the control gates 563, 565 are disposed, adjacent to each other, on the opposite side of switching device 550, and are separated by the intermediate transition region 555.

Potentials can be applied independently to the control gates 562-565, to generate the first depletion region 551 and the second depletion region 552, so that the conducting channel 510 is curvilinear. To this end, control gates 562 and 563 are paired, so that when a potential V1 is applied to the control gate 562 and a potential V2 is applied to the control gate 563, a first portion 520 of the conducting channel 510 is formed. Similarly, when a potential V'1 is applied to the control gate 564 and a potential V'2 is applied to the control gate 565, a second portion 522 of the conducting channel 510 is formed.

The switching device 550 further includes a plurality of gate oxide layers 572, 573, 574, and 575 that separate the control gates 562, 563, 564, and 565 from their respective depletion regions 551, 552.

While FIG. 6A illustrates four control gates 562-565 and one the intermediate transition region 555, it should be clear that more than four gates and one intermediate transition region 555 can be successively used to form the switching device 550.

Figure 7:
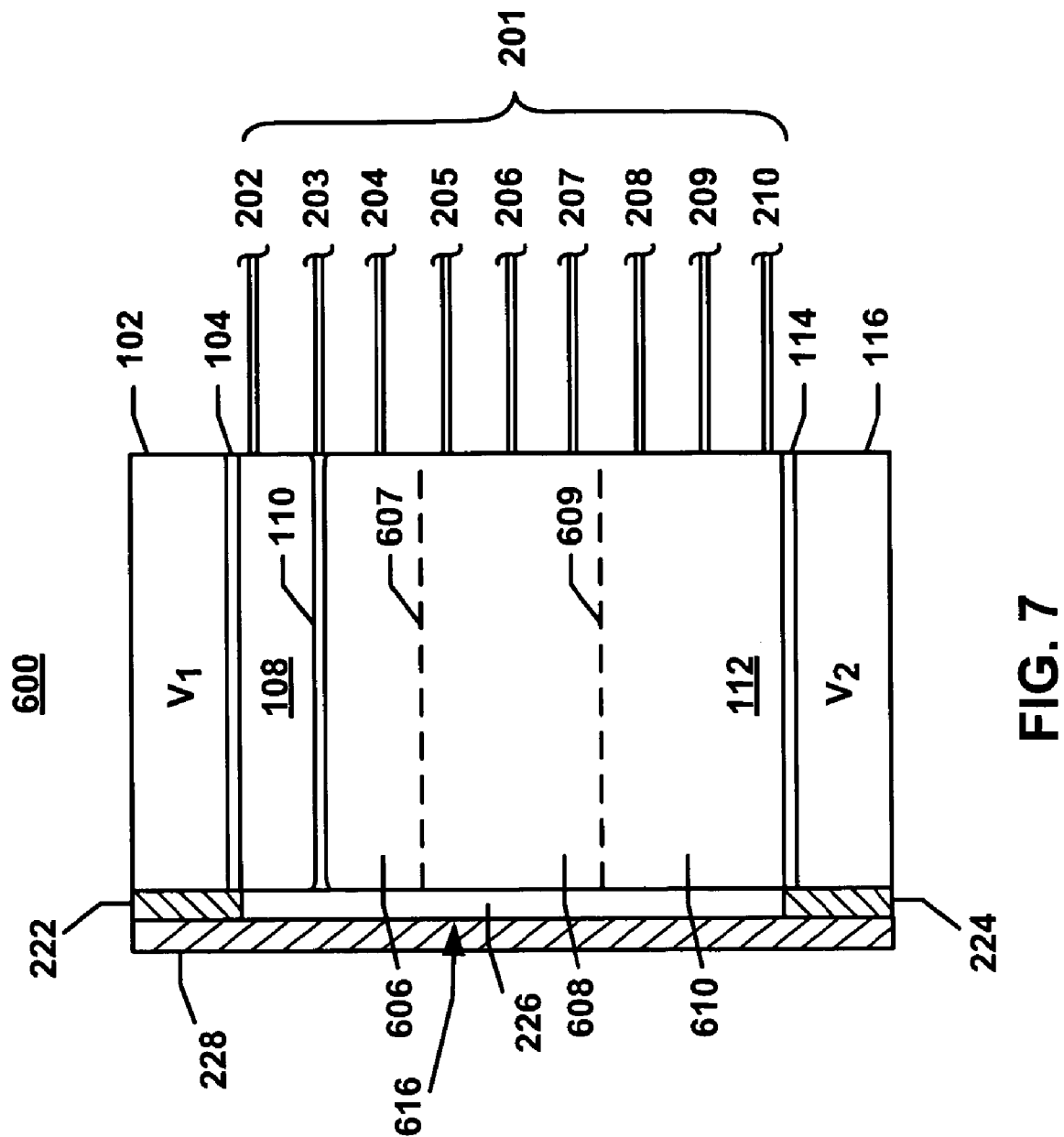
FIG. 7 is a schematic illustration of a further embodiment of the multiplexing device of the previous figures, wherein the scanning region is formed of a plurality of discrete regions.

FIG. 7 illustrates yet another multiplexing device 600 according to the present invention. Multiplexing device 600 is generally similar in construction to any of the previous multiplexing devices of FIGS. 1-6, but will be described, for simplicity of illustration, in connection with the design of multiplexing device 200 of FIG. 3. FIG. 7 illustrates the feature that the scanning region 616 could be continuous or formed of a plurality of discrete sub-regions, such as sub-regions 606, 608, 610 with boundaries 607, 609 therebetween.

Figure 7A:
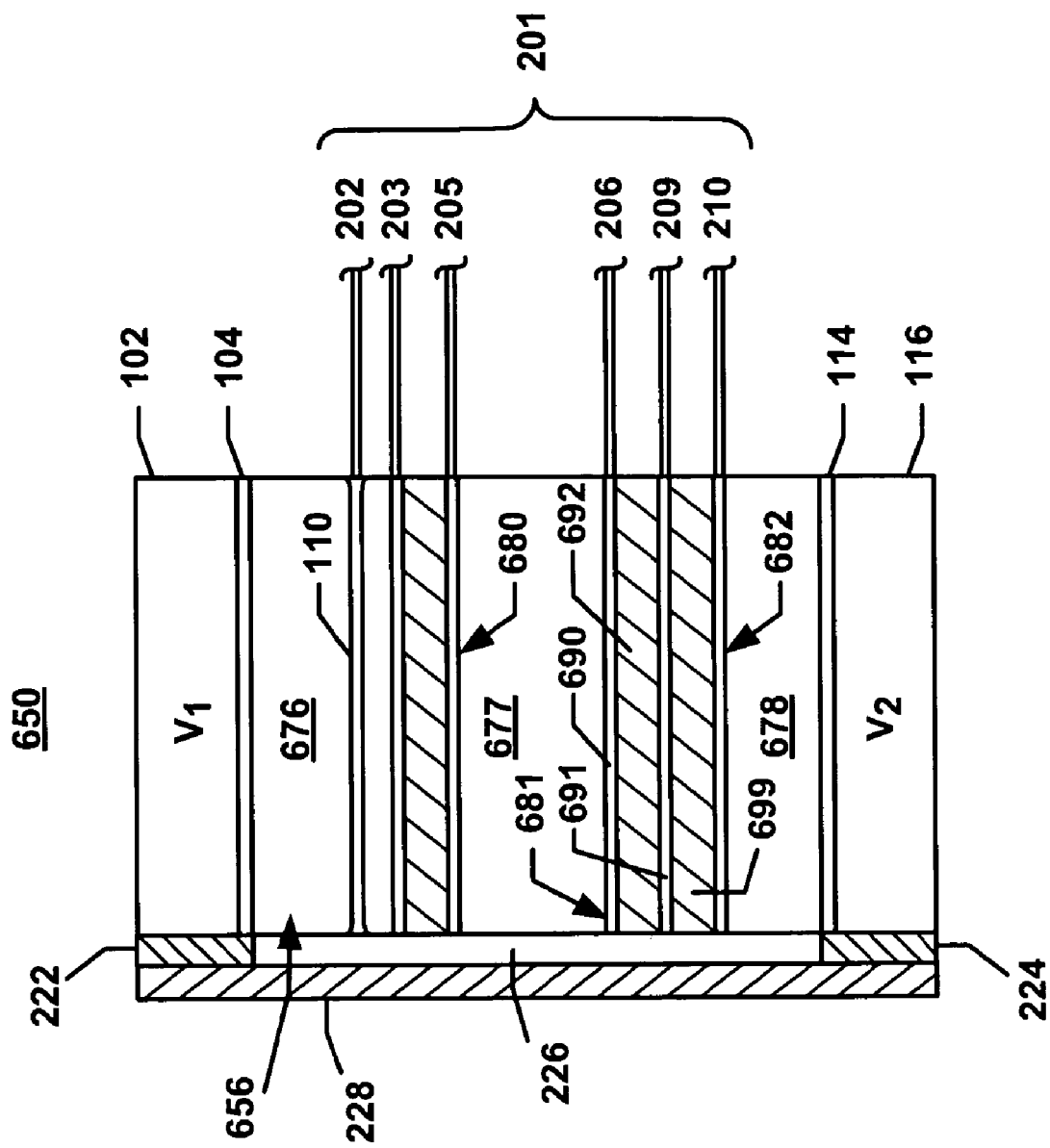
FIG. 7A is a schematic illustration of a further embodiment of the multiplexing device of FIG. 7, showing alternative embodiments of the discrete regions.

FIG. 7A illustrates a further multiplexing device 650 according to the present invention. Multiplexing device 650 is generally similar in construction to multiplexing device 600 of FIG. 7. The scanning region 656 of multiplexing device 600 is formed of a plurality of discrete sub-regions, such as sub-regions 676, 677, 678, with intermediate regions 680, 681, 682 therebetween. The intermediate regions 680, 681, 682 serve the function of extending the depletion regions 676, 677, 678 and further isolating the conducting channels from each other.

While only three intermediate regions 680, 681, 682 are illustrated, it should be clear that one or more intermediate regions may be formed. In this particular embodiment, the intermediate regions 680, 681, 682 are generally similar in design and construction, and are dispersed along the scanning region 656. In another embodiment, the intermediate regions 681, 682 are disposed contiguously to each other. The spacing between the intermediate regions 680, 681, 682 and the widths of all the regions in the embodiments described herein, could be changed to suit the particular applications for which the multiplexing devices are designed.

Considering now an exemplary intermediate region 681, it is formed of two semiconductor layers 690, 691 with an intermediate layer 692 having a high dielectric constant material that is sandwiched between the semiconductor layers 690, 691. According to another embodiment, the intermediate layer 692 is made of a semiconducting material that is different from that of layers 690 and 691 to form a quantum well structure.

Intermediate region 682 includes an intermediate region 699 that is generally similar to the intermediate region 692. Alternatively, the intermediate regions 692, 699 could have different work functions than the work function of semiconductor layer 691 so as to produce a quantum well function.

Figure 8:
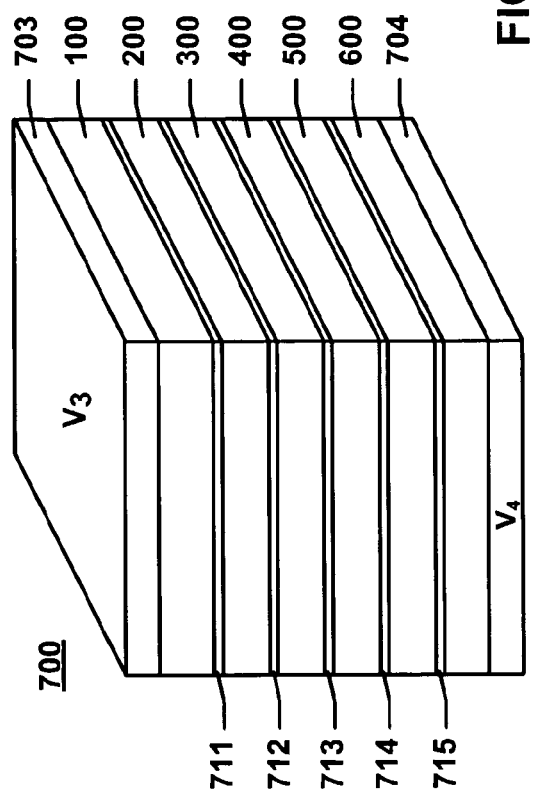
FIG. 8 is a schematic illustration of still another embodiment of the present invention, exemplifying a three-dimensional configuration comprised of a plurality of stackable multiplexing devices.

FIG. 8 illustrates another multiplexing device 700 of the present invention, exemplifying a three-dimensional configuration. Multiplexing device 700 is comprised of a plurality of stackable multiplexing devices, such as multiplexing devices 100, 200, 300, 400, 500, 600, that can be different or similar. Each of these stackable multiplexing devices can be independently controlled as described in connection with FIGS. 1-7.

According to this embodiment, one, or a group of multiplexing devices 100, 200, 300, 400, 500, 600 can be selected by applying suitable depletion potentials $V_3$, $V_4$, to two outer electrodes 703, 704, respectively. Once the multiplexing device or a group of multiplexing devices 100, 200, 300, 400, 500, 600 is selected, the selected multiplexing device or a group of multiplexing devices 100, 200, 300, 400, 500, 600 is operated individually, as described earlier. In addition, a high-K insulation layer (e.g., 711, 712, 713, 714, 715) is interposed between two contiguous multiplexing devices (e.g., 100, 200, 300, 400, 500, 600).

Figure 9:
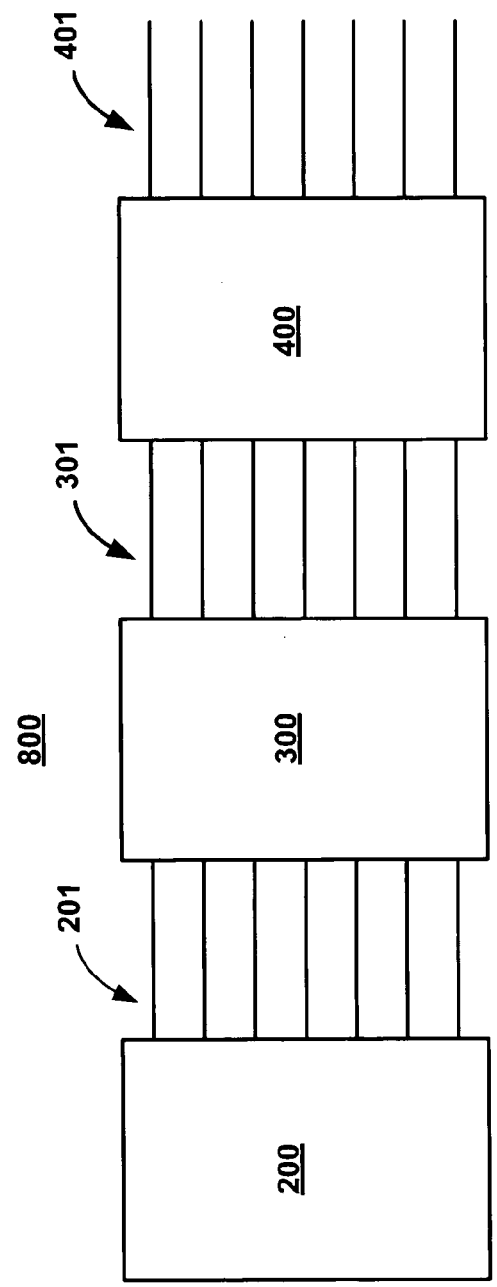
FIG. 9 is a block diagram illustrating a serial connectivity of a plurality of multiplexing devices of the previous figures.

FIG. 9 illustrates another multiplexing device 800 of the present invention, exemplifying the serial connectivity of a plurality of multiplexing devices, such as multiplexing devices 200, 300, 400. Each of these serially connected multiplexing devices 200, 300, 400 can be independently controlled, and the output of one multiplexing device used to control the accessibility of the subsequent multiplexing device.

Figure 10:
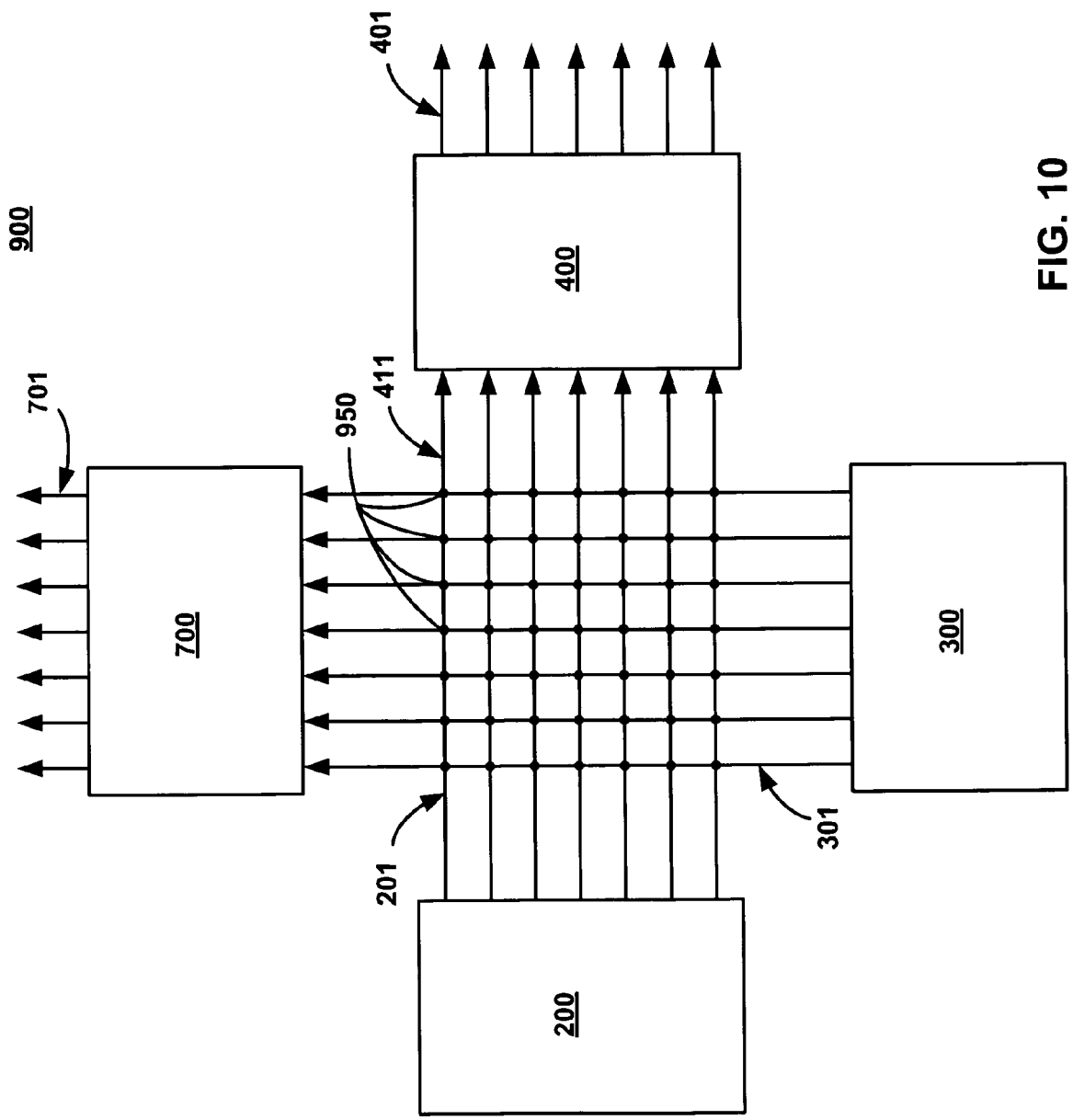
FIG. 10 is a perspective view of an exemplary multi-node cross-point array configuration using a plurality of multiplexing devices of the previous figures, illustrating a two-dimensional architecture.

FIG. 10 is a perspective view of an exemplary multi-node cross-point array 900 using at least two multiplexing device, e.g., 200, 300 whose respective outputs are selected as described above, onto output lines 201, 301, are selected as described above. The selected outputs are processed (collectively referred to as "processed outputs"), as desired, by for example, operational devices 950. The processed outputs can be used directly, or, as illustrated in FIG. 10, they can be further fed to one or more multiplexing devices, e.g., 400, 700, resulting in outputs that are fed to respective output lines 400, 700.

The operational devices 950 could be, for example, memory cells, logic devices, current-driven or voltage-driven elements, such as light emitters, heat emitters, acoustic emitters, or any other device that requires addressing or selective accessibility.

As an example, the operational device 950 can include a switchable element that is responsive to current change or voltage change, or phase change, resulting in change of resistance or magneto-resistance, thermal conductivity or change in electrical polarization. Alternatively, the operational devices can include a carbon nano tube, a cantilever, a resonance driven device, or a chemical or biological sensor.

Figure 11:
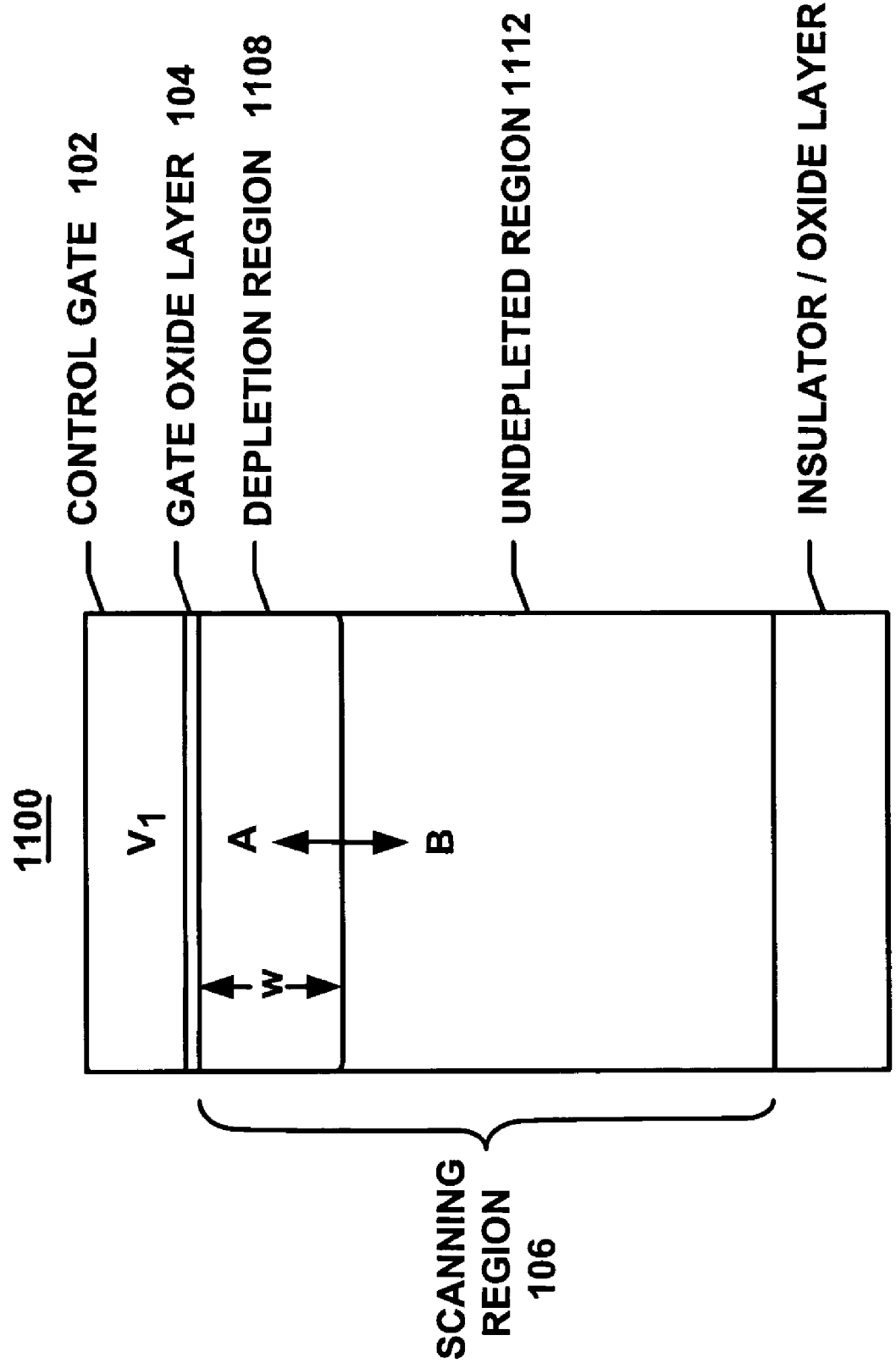
FIG. 11 is a schematic illustration of another exemplary multiplexing device of the present invention that is similar to the multiplexing device of FIG. 1, where the depletion region is controlled by a single electrode.

FIG. 11 is a schematic illustration of another exemplary multiplexing device 1100 according to the present invention. The multiplexing device 1100 is generally similar in design and operation to the multiplexing device 100 of FIG. 1, and comprises a conducting region 1112 that is controllably scannable within a scanning region 106. The gate oxide layer 104 is disposed intermediate the scanning region 106 and the control gate 102, at one end of the multiplexing device 1100. At the opposite end of the multiplexing device 1100, an insulator layer, such as an oxide layer 1114, is disposed contiguously to the scanning region 106. It should be clear that the insulator layer 1114 is optional.

The depletion region 1108 is controlled by applying a potential V1 to the control gate 102, in order to generate the conducting region 1112. An important feature of the multiplexing device 1100 is to control the width w of the depletion region 1108 using a single control gate 102. Unlike the multiplexing device 100, the undepleted region 1112 of the multiplexing device 1100 is not necessarily a small region. It could, in some cases, encompass the entire scanning region 106 under the control gate 102 and the gate oxide 104. As further illustrated in FIG. 12, the multiplexing device 1100 enables concurrent multibit sequential programming.

Figure 12:
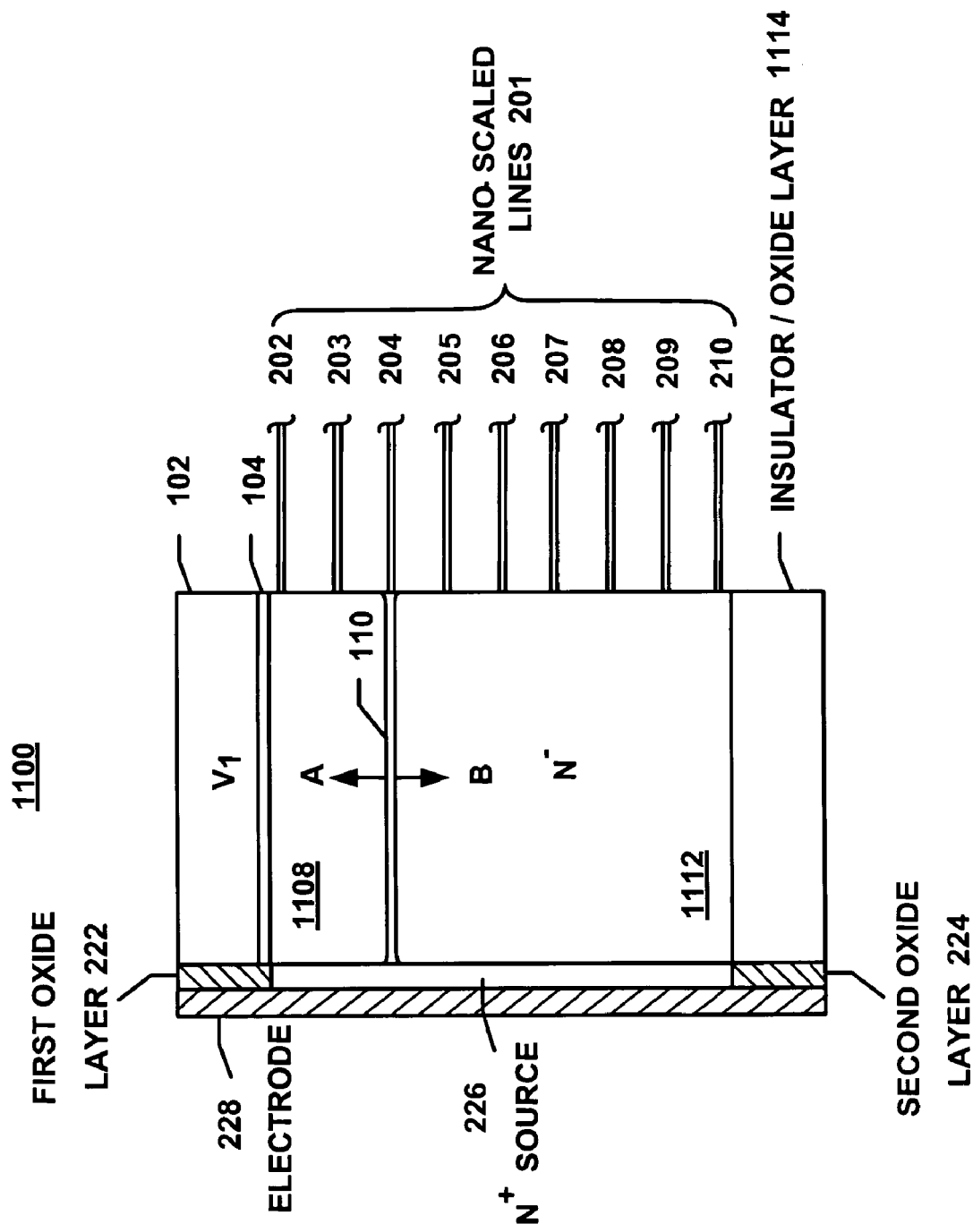
FIG. 12 is a schematic illustration of the multiplexing device of FIG. 11, wherein the scannable conducting channel connects conducting lines, such as nano-scaled lines, on one side of the multiplexing device to electrodes on the opposite side of the multiplexing device.

FIG. 12 is a schematic illustration of the multiplexing device 1100 of FIG. 11, wherein the scannable conducting channel 110 connects conducting lines, such as nano-scaled lines 201, on one side of the multiplexing device 1100 to electrodes (or to a micro line) on the opposite side of the multiplexing device 1100. Since the multiplexing device 1100 comprises a single control gate (or electrode) 102, many nano-scaled lines 201 could be selected for any value of the control gate potential $V_1$. This requires a serial access scheme as compared to a random access scheme used by the embodiments of FIGS. 1-8.

Figure 13:
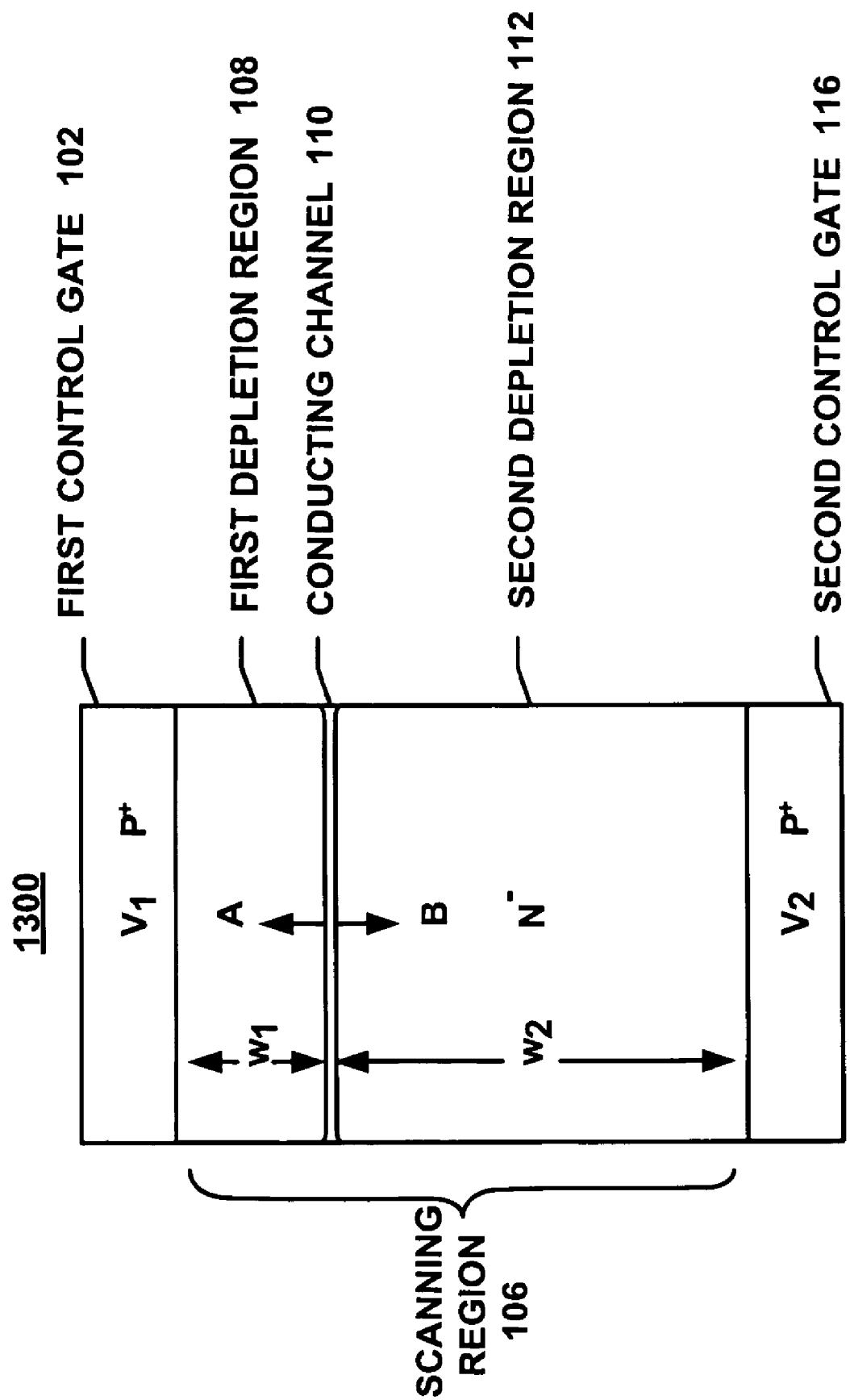
FIG. 13 is a schematic illustration of the multiplexing device of FIG. 1, where the depletion region is controlled by applying a reverse bias to a p-n (or p+-n or n+-p junction)

FIG. 13 is a schematic illustration of a multiplexing device 1300 that is similar to the multiplexing device 100 of FIG. 1, but without the two gate oxide layers 104, 114. In the previous embodiments, the depletion regions 108, 112 were comprised, for example of a depletion region of a Metal Oxide Semiconductor (MOS) system. However, the depletion regions 108, 112 of the multiplexing device 1300 of FIG. 13 form two p+-n junctions (or alternatively one p+-n junction) with the adjacent control gates 102, 116, respectively. In an alternative embodiment, the depletion regions 108, 112 form two n+-p junctions (or alternatively one n+-p junction) with the adjacent control gates 102, 116, respectively.

By applying potentials $V_1$ and $V_2$ to the p+ regions (control gates 102 and 116), a conduction channel 110 could be formed in around the middle of the scanning region 106. One of the advantages of this multiplexing device 1300 is that the breakdown voltages of p-n junctions can be higher than the gate oxide breakdown voltages. This means that higher voltages could be applied to the control gate 102, 116. This could also mean that the scanning region 106 could be bigger. In an alternative embodiment, the multiplexing device 1300 could be formed of a single control gate, such as control gate 102.

In yet another embodiment, the depletion regions 108, 112 of the multiplexing device 1300 are formed by Schottky barriers (Metal-semiconductor regions), wherein the first and second control gates 102 and 116 are formed of a metal material. The depletion width in the Schottky barrier is controlled much the same way as the depletion width in a p-n junction.

Similarly to the illustration of FIG. 3, it is possible to select nano-scaled lines 201 by applying appropriate potentials V1 and V2 to the first and second control gates 102, 116, respectively, and connect it to the micro-scaled line or source 226. Alternatively Schottky barriers (metal-n or metal-p) regions may be used to do the connection as well.

Figure 14:
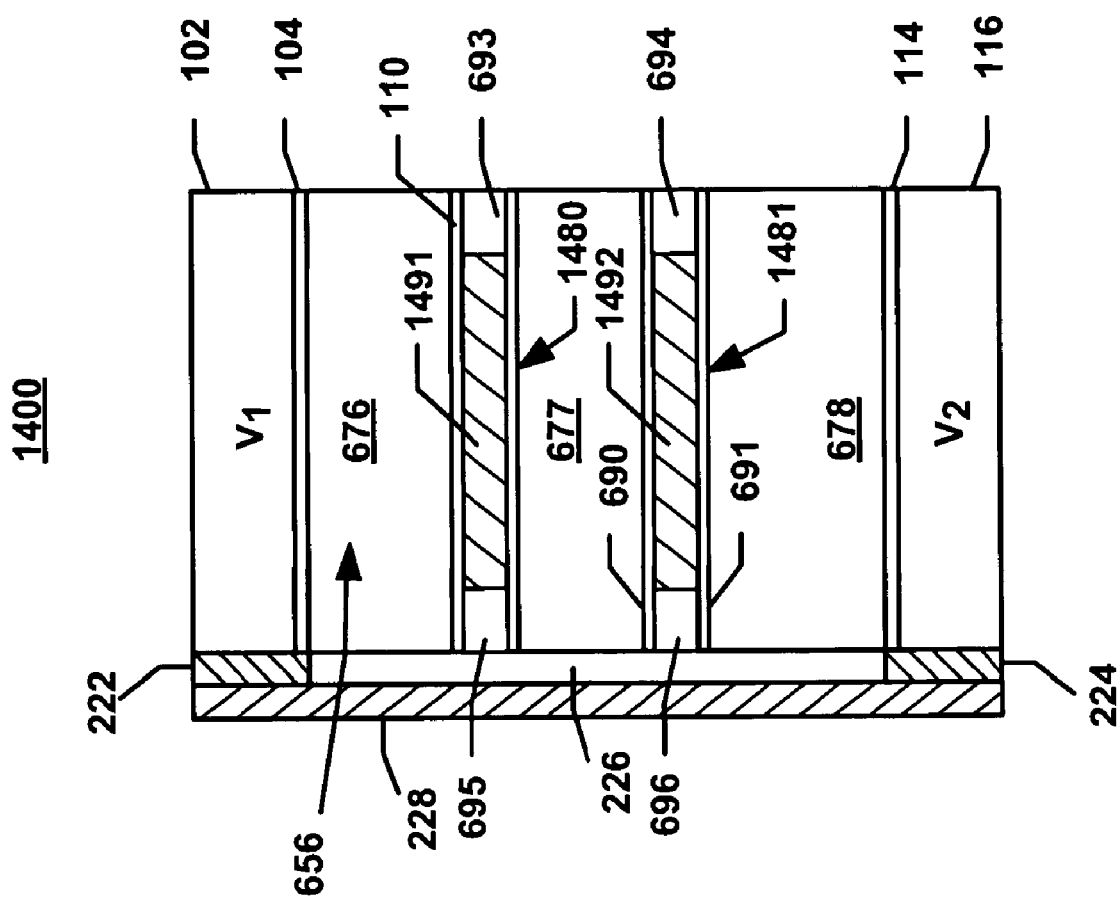
FIG. 14 is a schematic illustration of another embodiment of the multiplexing device of FIG. 7A, showing alternative embodiments of the intermediate regions.

FIG. 14 is a schematic illustration of another multiplexing device 1400 according to the present invention. The multiplexing device 1400 is generally similar in function and operation to the multiplexing device 650 of FIG. 7A, and shows an alternative embodiment of the intermediate regions 1480, 1481, in order to illustrate an exemplary instance of nano-pillar addressing.

In this embodiment, the semiconducting depletion regions 676, 677, 678 are physically separated through a combination of dielectrics (e.g., oxide/nitride/high-K) and electrode/semiconducting regions that are referred to as intermediate regions 1480, 1481. This allows a reduction in the leakage between the bits and extends the range of the maximum depletion region possible. This may also allow low voltage operation. Though only three semiconducting depletion regions 676, 677, 678 and two intermediate regions 1480, 1481 are shown for illustration purpose only, it should be clear that a different number of regions could alternatively be used.

Each semiconductor depletion region 676, 677, 678 is bounded by at least one thin dielectric layer, e.g., 690, 691, which is preferably but not necessarily composed of an oxide in order to passivate the sidewalls and to guarantee good electrical properties. Sandwiched between layers 690 and 691 in each intermediate region 1480, 1481 is a high-K dielectric material 1491, 1492, respectively. This minimizes the voltage drop between the intermediate regions 1480, 1481 while maintaining isolation. The high-K dielectric material 1492 could be any dielectric with a reasonable dielectric constant, wherein a higher dielectric constant provides better electrical properties.

Each of the intermediate regions 1480, 1481 further comprises two side insulation regions on opposite ends of the high-K dielectric material 1491, 1492. More specifically, intermediate region 1480 further comprises two side insulation regions 693, 695, and intermediate region 1481 further comprises two side insulation regions 694, 696. Side insulation regions 693-696 isolate the high-K dielectric material 1491, 1492 from the semiconducting depletion regions 676, 677, 678.

Alternatively, each of the dielectric layers 690, 691 comprises a thin dielectric material, typically oxide, that bounds the semiconducting depletion regions 676, 677, 678. However, the intermediate regions 1480, 1481 between the dielectric layers 690, 691 are filled with a semiconducting material or a metal material to form regions 1491, 1492. Each of the regions 1491, 1492 is preferably floating and its potential depends on the capacitive coupling of the different control electrodes 102, 114 to these regions 1491, 1492.

This design is desirable for the following reasons. A heavily doped semiconductor or metallic region further minimizes the applied voltage requirements. In addition, the work function difference between the electrode/semiconductor region 1492 and the semiconductor region results in an inversion layer (thin layer of electrons) at the interface of the semiconducting depletion regions 676, 677, 678. This allows the multiplexing device 1400 to work via the depletion of the inversion layer charge as opposed to a charge resulting from ionized dopant atoms, and therefore minimizes dopant fluctuation effects. In this case, insulation regions 693-696 are required to prevent shorting of the electrodes (i.e., 1491, 1492) to the various semiconducting depletion regions 676, 677, 678 and to keep it electrically isolated. This effect is further illustrated in FIG. 15 using the example of a simple MOS device 1500.

As further illustrated in FIG. 7A, the multiplexing device 1400 of FIG. 14, wherein the scannable conducting channel 110 could be connected to conducting lines, such as nano-scaled lines 201, on one side of the multiplexing device 1400 to electrodes (or micro lines) on the opposite side of the multiplexing device 1400.

Figure 15:
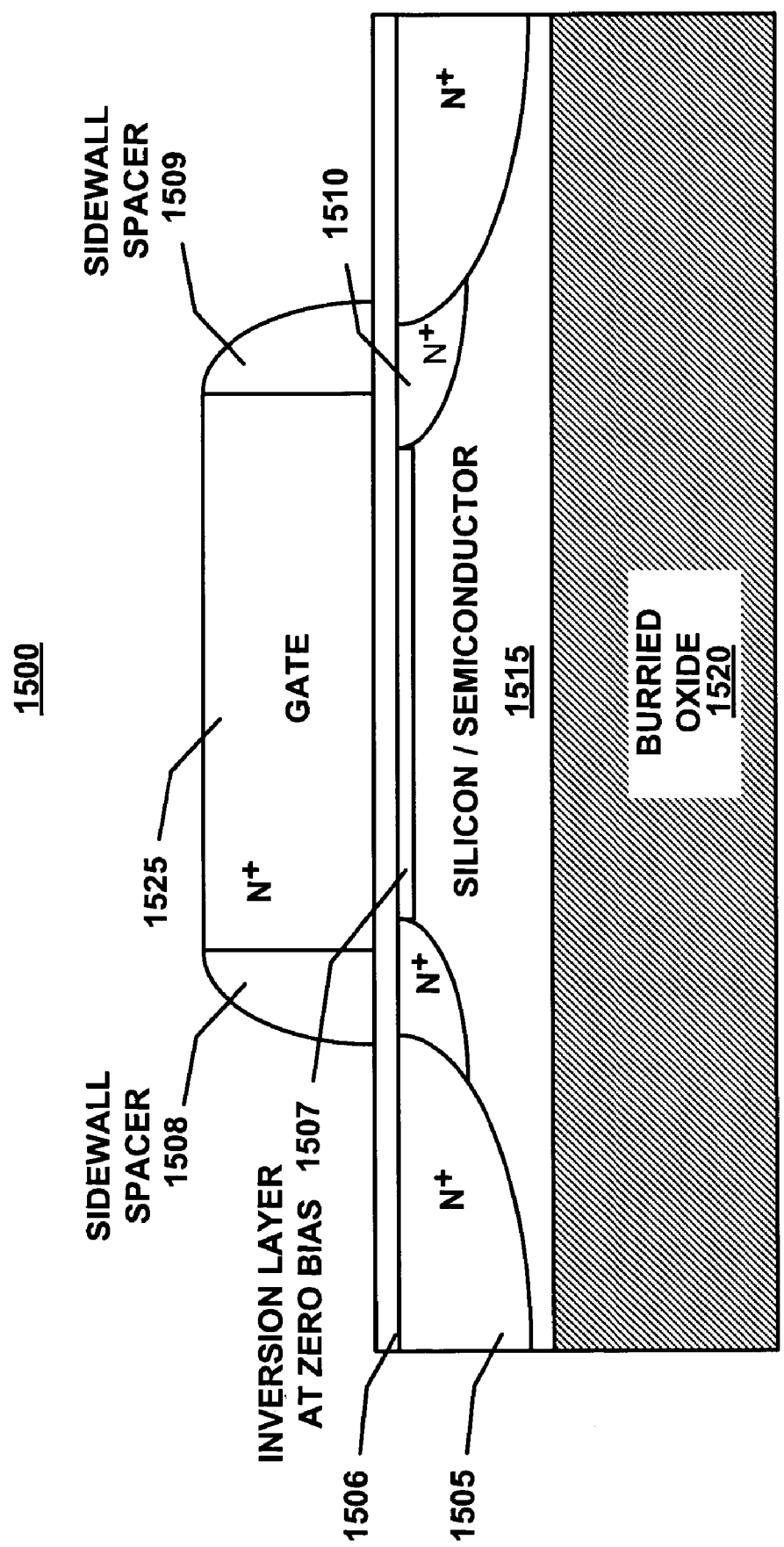
FIG. 15 is a schematic illustration of a semiconductor-on-insulator (e.g., SOI) MOSFET that shows the effects of a floating polysilicon region in the multiplexing device of FIG. 14.

FIG. 15 illustrates the effect of including floating polysilicon/electrode regions (1491 and 1492 in FIG. 14 or 1525 in FIG. 15) in semiconducting structure 1500. Structure 1500 is generally formed of a silicon on insulator (SOI) wafer with a thin (e.g., less than approximately 100 nm) silicon region on top of an insulator (oxide). The MOS device includes an n-channel device with n+ source regions 1505 and drain regions 1510. The gate 1525 is formed of n+ polysilicon material. At zero bias gate, the potentials of the source 1505 and drain 1510 develop an inversion layer 1507 in the channel of semiconductor region 1515. This inversion layer 1507 is generated because of the work function difference between the gate 1525 and the silicon/semiconductor 1515. This work function difference causes the bands in the silicon 1515 at zero gate voltage to bend in much the same way as a transistor with positive applied bias. This inversion charge in the addressing scheme may be depleted in much the same way as dopant charge. One way to think about the transistor in FIG. 15 is that it emulates a negative threshold voltage transistor.

Figure 16:
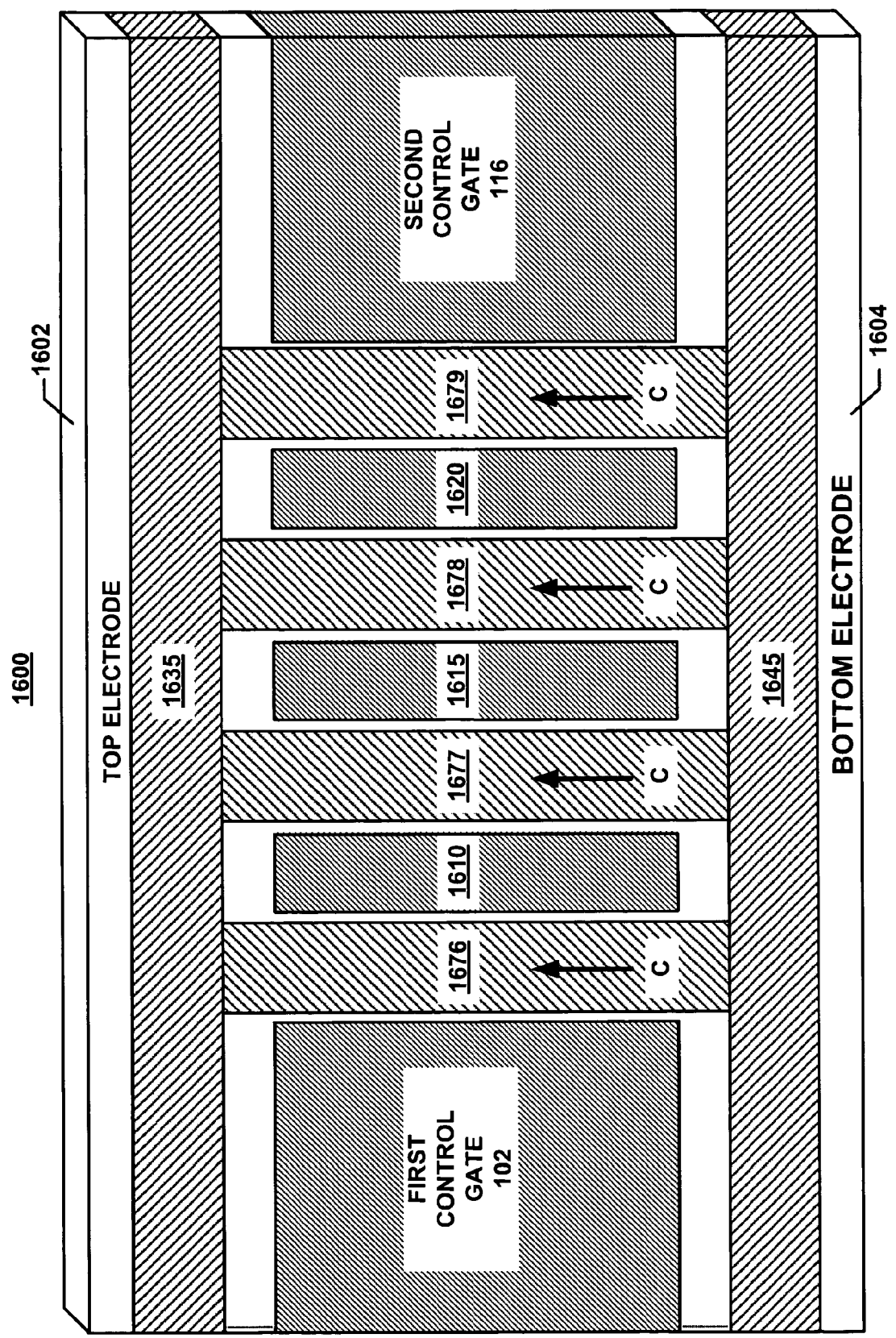
FIG. 16 is an isometric, schematic illustration of the multiplexing device of FIG. 14, rotated about its side.

Referring now to FIG. 16, it illustrates a multiplexing device 1600 according to the present invention. Multiplexing device 1600 is generally similar to multiplexing device 1400 of FIG. 14, but is rotated about its side. Multiplexing device 1600 comprises a plurality of nano-pillars 1676, 1677, 1678, 1679 that are interposed between the first control gate 102, the second control gate 116, and intermediate regions 1610, 1615, 1620. The intermediate regions 1610, 1615, 1620 are generally similar in construction and operation to the intermediate regions 1480, 1481 of FIG. 14. While four nano-pillars 1676, 1677, 1678, 1679 are illustrated, it should be clear that a different number of nano-pillars can be selected. A plurality of oxide/dielectric layers 1686, 1687, 1688 surround the intermediate regions 1610, 1615, 1620 to isolate them from the nano-pillars 1676, 1677, 1678, 1679, and the operational devices 1635, 1645.

Arrows C indicate the direction of the electrical currents flowing through one or more nano-pillars 1676, 1677, 1678, 1679 selected by depletion, as described earlier. While the direction of the current is shown in the current direction, it should be clear that the current could alternatively flow in the opposite direction. The current flows between the two electrodes 1602, 1604, through operational devices 1635, 1645 (denoted earlier as operational devices 950).

Figure 17:
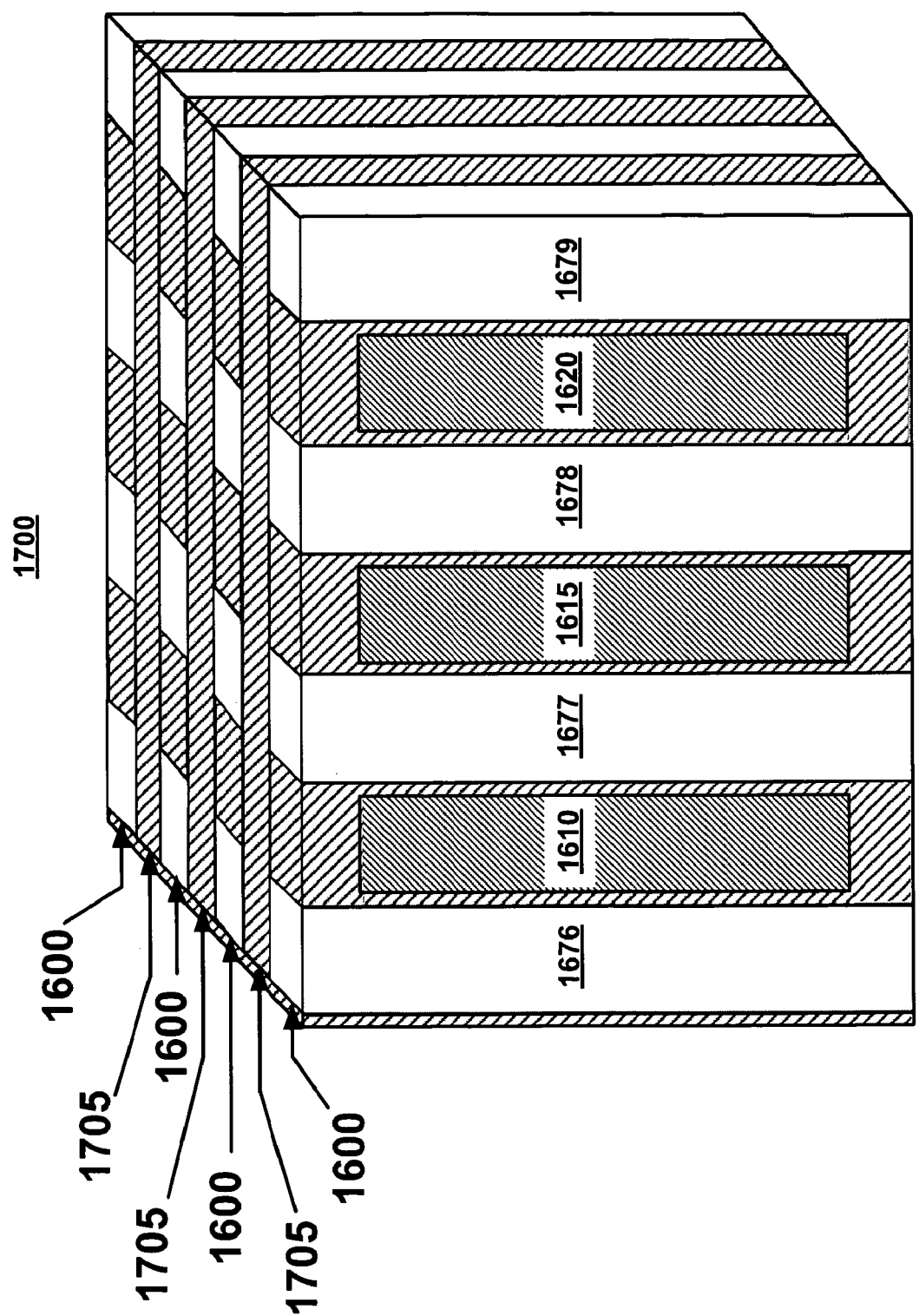
FIG. 17 is an isometric view of a multiplexing array formed of an array of multiplexing devices of FIG. 16.

FIG. 17 shows a multiplexing array 1700 that is formed of an array of multiplexing devices 1600 of FIG. 16, with the electrodes 1602, 1604, the operational devices 1635, 1645, and the control gates 102, 116 removed for clarity of illustration. The plurality of multiplexing devices 1600 are separated and insulated by a plurality of insulation layers 1705. The insulation layers 1705 are preferably, but not necessarily formed of oxide layers, and could alternatively be made of the same material as the intermediate region 1610. While only four multiplexing devices 1600 are illustrated, it should be clear that a different number of multiplexing devices 1600 can alternatively be used.

It is to be understood that the specific embodiments of the present invention that have been described are merely illustrative of certain applications of the principle of the multiplexing device. Numerous modifications may be made to the multiplexing device without departing from the spirit and scope of the present invention.

What is claimed:

1. A multiplexing system comprising:
   at least two electronically scannable multiplexing devices that are independently controlled and are stacked relative to each other,
   wherein the at least two scannable multiplexing devices are interconnected in series,
   wherein an output of a first scannable multiplexing device is used to control accessibility of a subsequent multiplexing device and
   wherein each scannable multiplexing device comprises:
      a scanning region;
      two gates disposed at different locations relative to the scanning region;
      wherein upon application of potentials to the two gates, two depletion regions within the scanning region, interact to generate a conducting channel within the scanning region; and
      wherein the conducting channel is controllably scannable within the scanning region by varying the potentials applied to the two gates.

* * * * *